(12) United States Patent
Tatsuno

(10) Patent No.: US 12,223,991 B2
(45) Date of Patent: Feb. 11, 2025

(54) SEMICONDUCTOR STORAGE APPARATUS

(71) Applicant: SONY SEMICONDUCTOR SOLUTIONS CORPORATION, Kanagawa (JP)

(72) Inventor: Taro Tatsuno, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 106 days.

(21) Appl. No.: 17/907,276

(22) PCT Filed: Apr. 7, 2021

(86) PCT No.: PCT/JP2021/014824
§ 371 (c)(1),
(2) Date: Sep. 26, 2022

(87) PCT Pub. No.: WO2021/210475
PCT Pub. Date: Oct. 21, 2021

(65) Prior Publication Data
US 2023/0115833 A1 Apr. 13, 2023

(30) Foreign Application Priority Data

Apr. 15, 2020 (JP) .................. 2020-072873
Nov. 11, 2020 (JP) .................. 2020-188271

(51) Int. Cl.
*G11C 11/16* (2006.01)
*H10B 61/00* (2023.01)
(52) U.S. Cl.
CPC ...... *G11C 11/1675* (2013.01); *G11C 11/1659* (2013.01); *H10B 61/00* (2023.02)

(58) Field of Classification Search
CPC .................. G11C 11/1675; G11C 11/1659
USPC ............................................. 365/158
See application file for complete search history.

(56) References Cited

U.S. PATENT DOCUMENTS

| | | |
|---|---|---|
| 2013/0051132 A1 | 2/2013 | Son |
| 2016/0163254 A1 | 6/2016 | Lee et al. |
| 2018/0075895 A1 | 3/2018 | Kishi et al. |

(Continued)

FOREIGN PATENT DOCUMENTS

| | | | |
|---|---|---|---|
| JP | 2004-185754 A | 7/2004 | |
| JP | 2007258460 A | * 10/2007 | ............. G11C 11/16 |
| JP | 2008-310876 A | 12/2008 | |

(Continued)

OTHER PUBLICATIONS

International Search Report and Written Opinion of PCT Application No. PCT/JP2021/014824, issued on May 18, 2021, 11 pages of ISRWO.

*Primary Examiner* — Huan Hoang
(74) *Attorney, Agent, or Firm* — CHIP LAW GROUP

(57) ABSTRACT

A semiconductor storage apparatus according to one embodiment of the present disclosure includes a plurality of memory cells and a control circuit. Each of the memory cells includes a magnetization reversal memory device and a first switch device that controls a current to flow to the magnetization reversal memory device. The control circuit performs a writing control based on an asymmetric property of a writing error rate curve line with respect to a writing voltage of the magnetization reversal memory device.

11 Claims, 15 Drawing Sheets

(56) References Cited

U.S. PATENT DOCUMENTS

2020/0241840 A1* 7/2020 Ikegami .............. G11C 11/1659

FOREIGN PATENT DOCUMENTS

| JP | 2011-192345 A | 9/2011 |
| JP | 2012-133829 A | 7/2012 |
| JP | 2014-093530 A | 5/2014 |
| JP | 2019-057343 A | 4/2019 |

* cited by examiner

[FIG. 1]
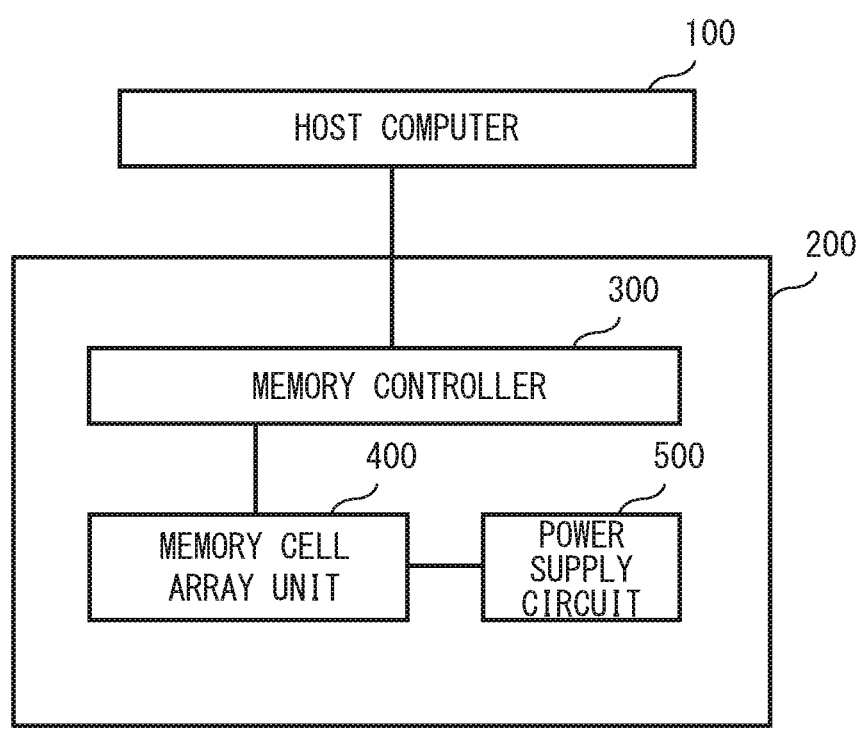

[FIG. 2]
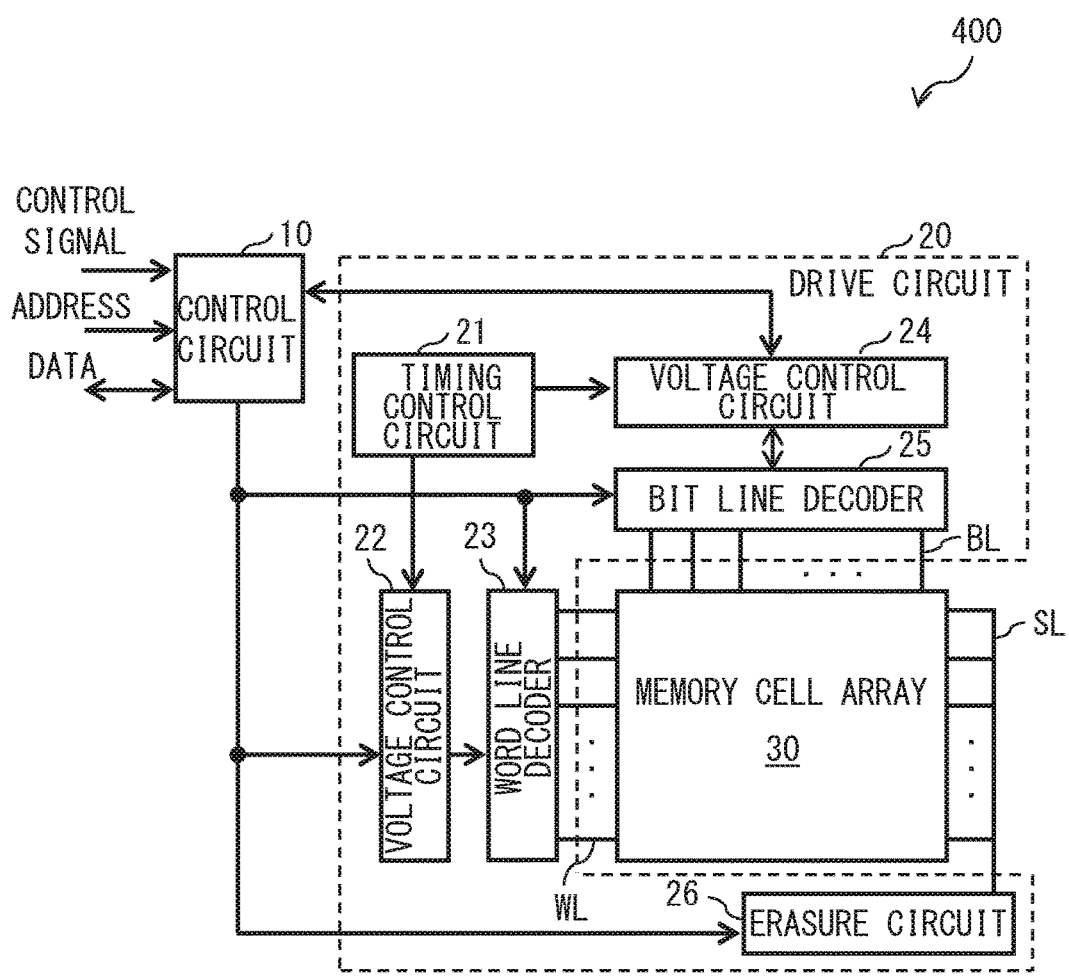

[FIG. 3]
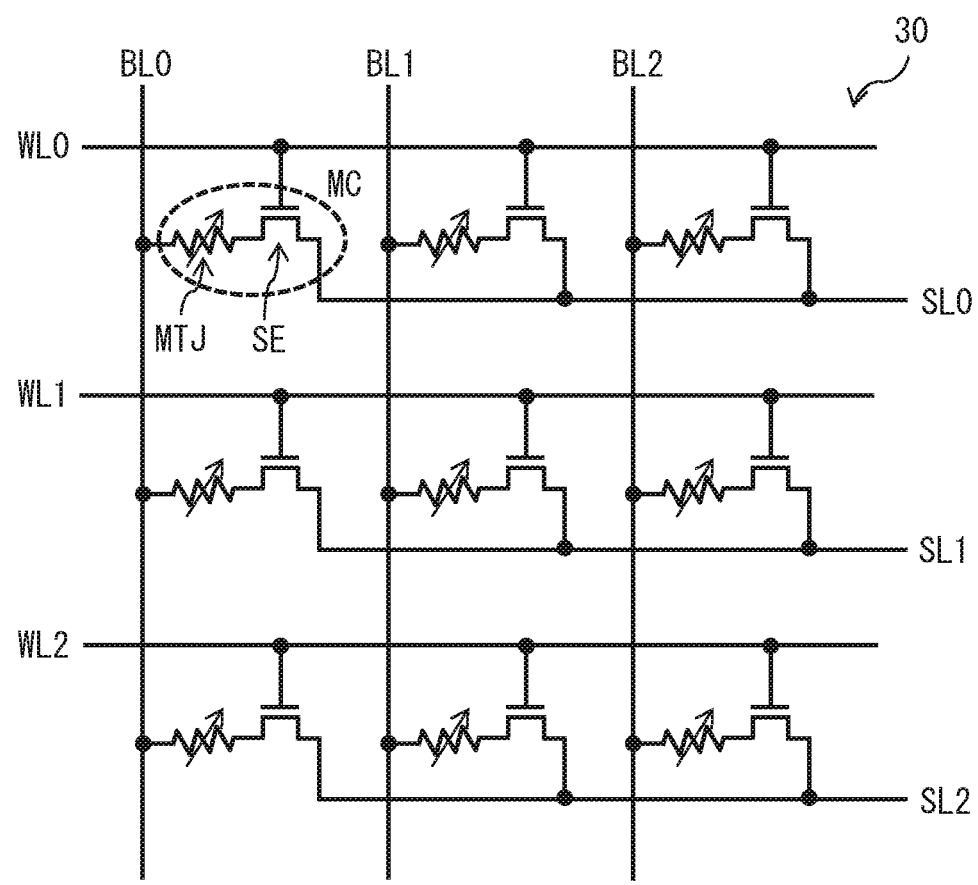

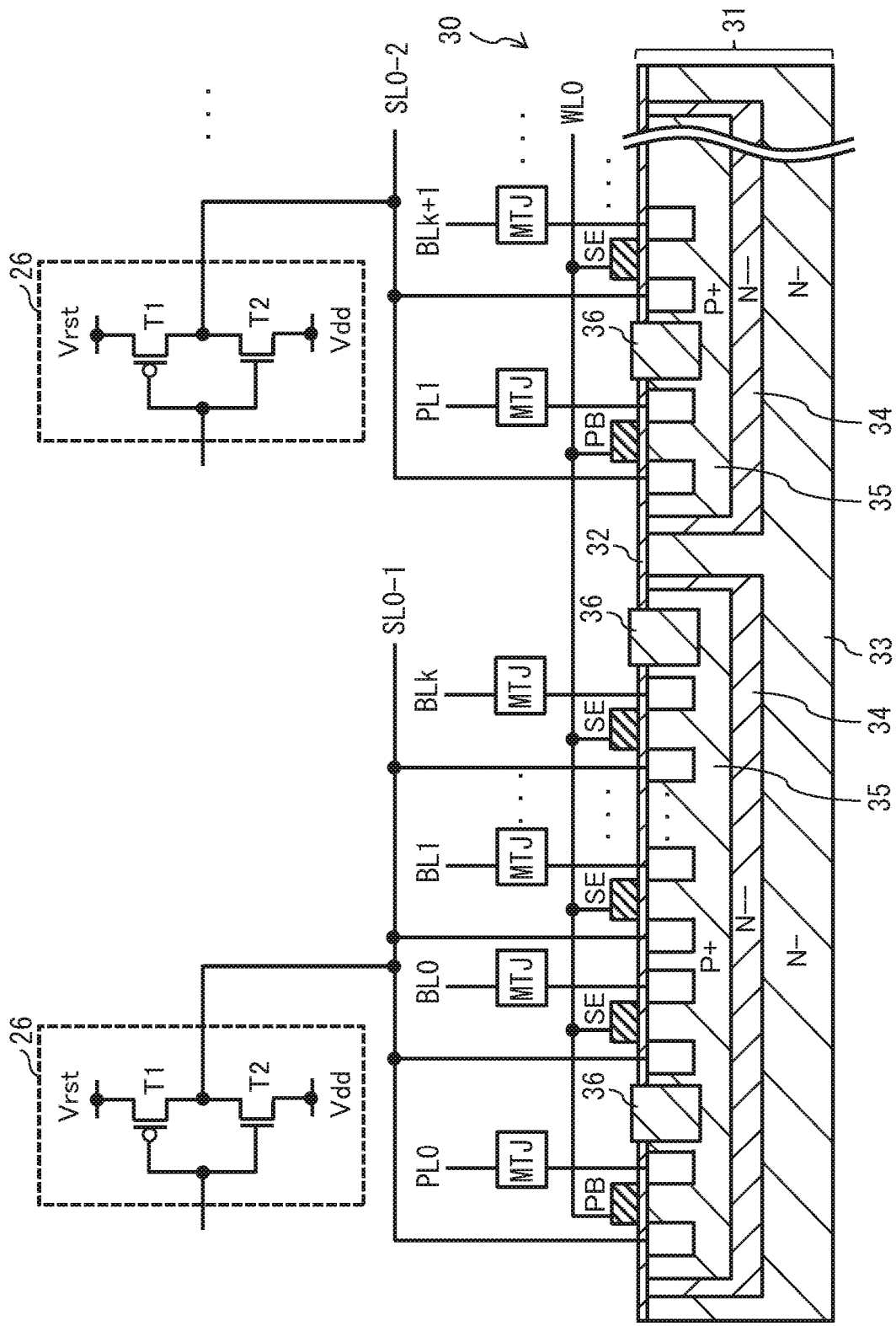
[FIG. 4]

[FIG. 5]
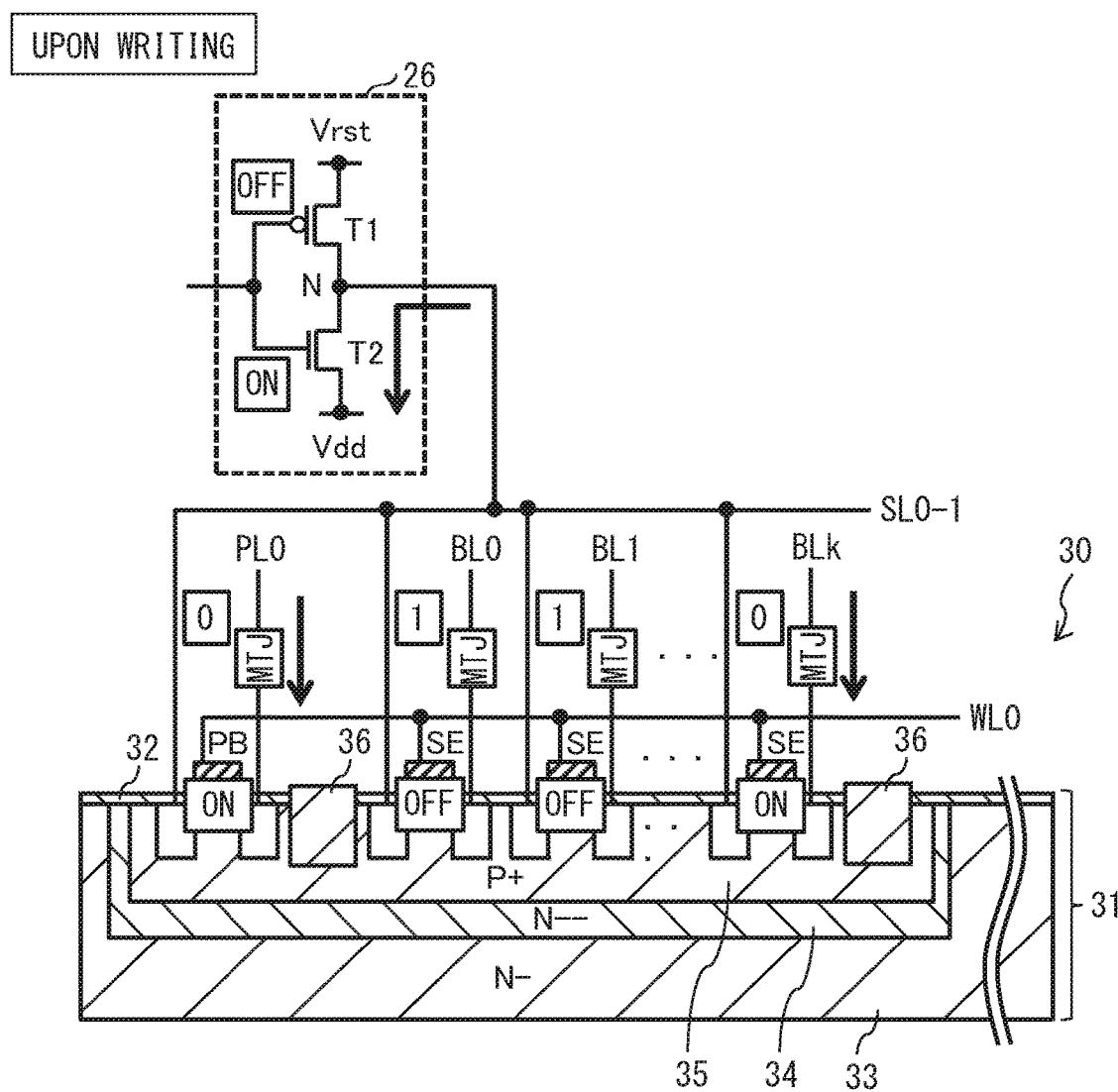

[FIG. 6]
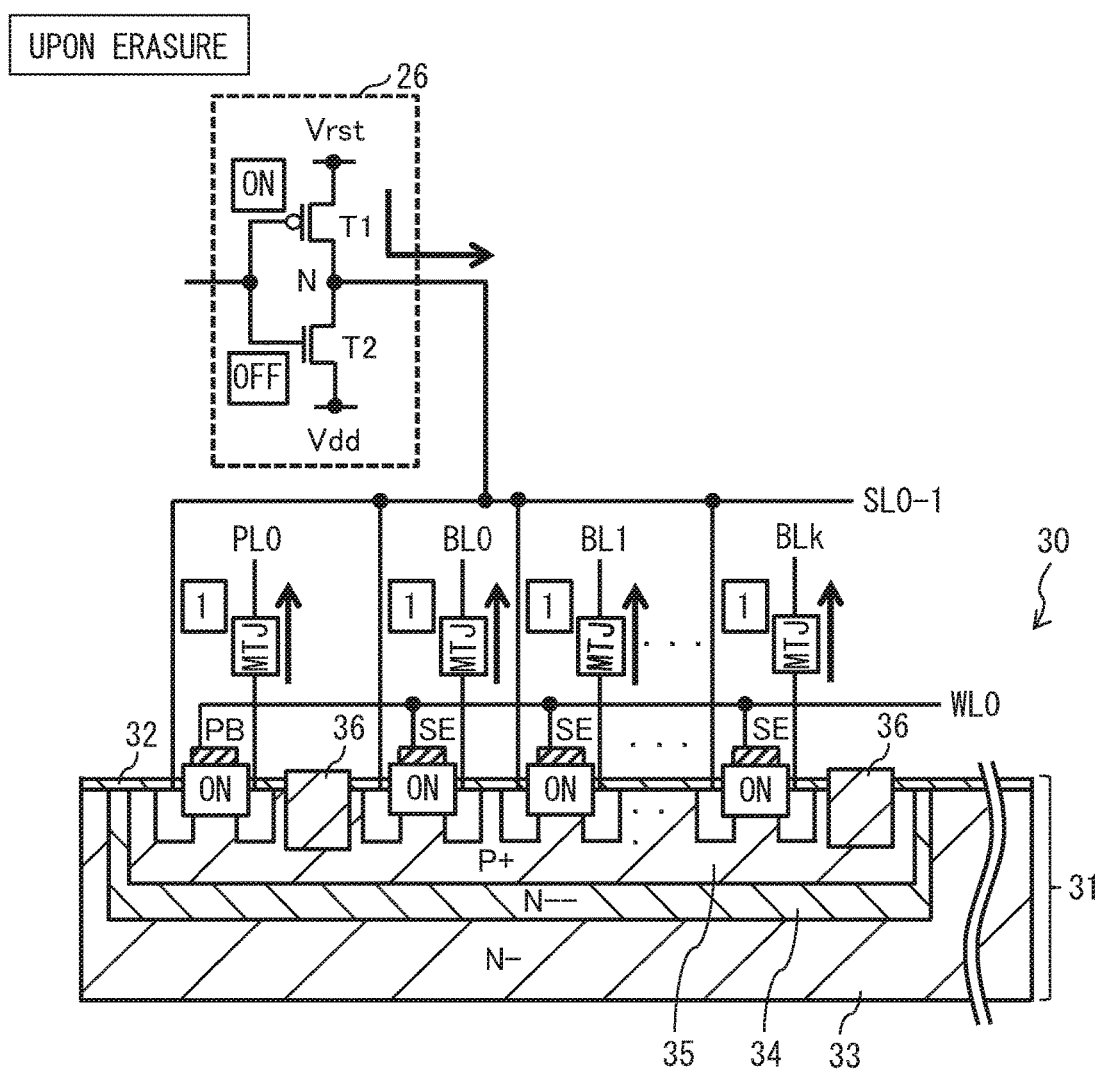

[FIG. 7]
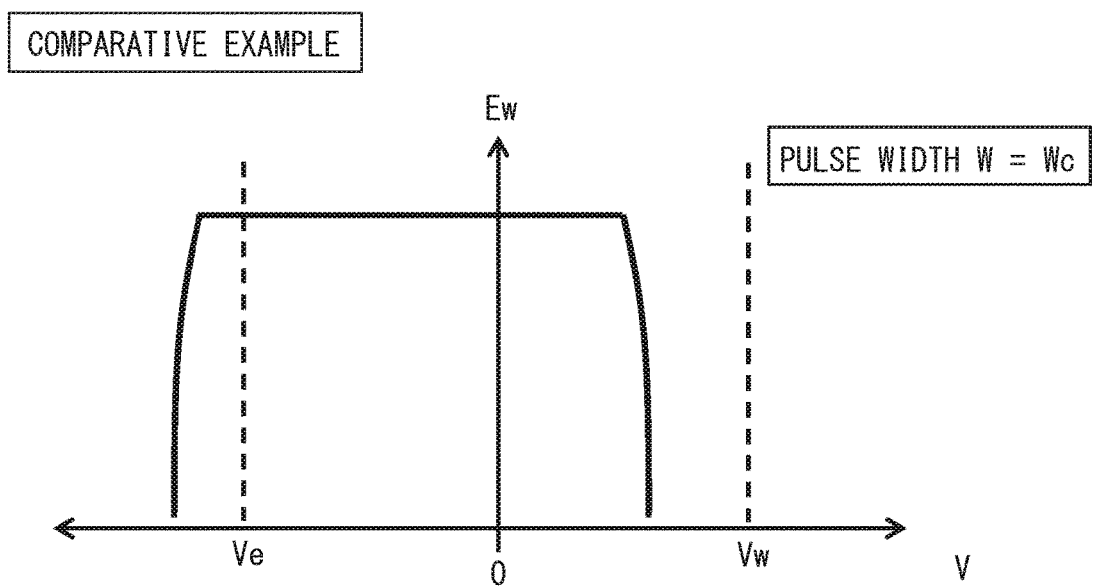

[FIG. 8]
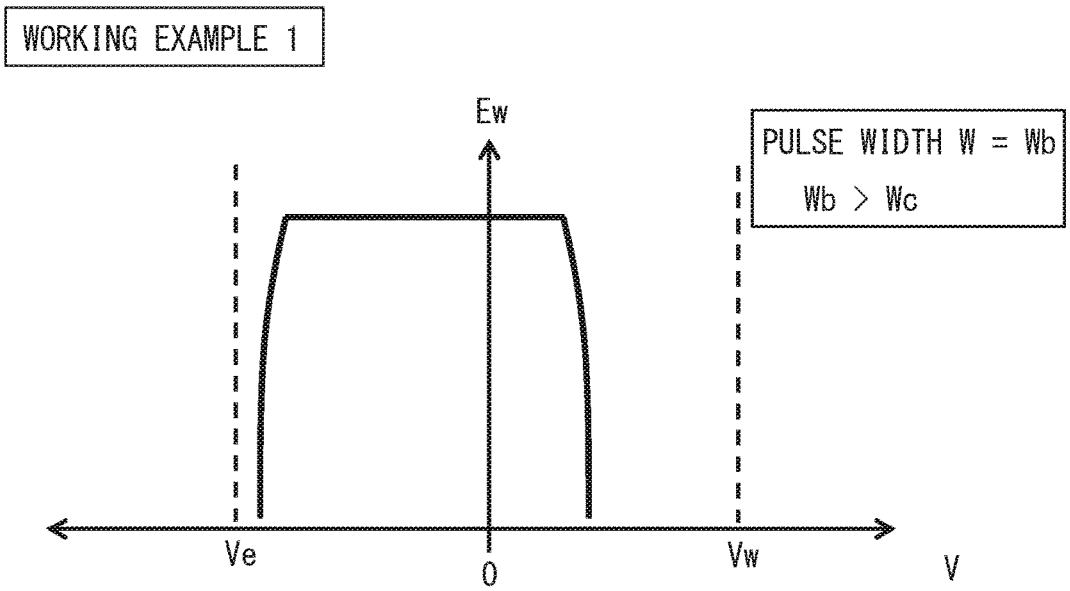
[FIG. 9]
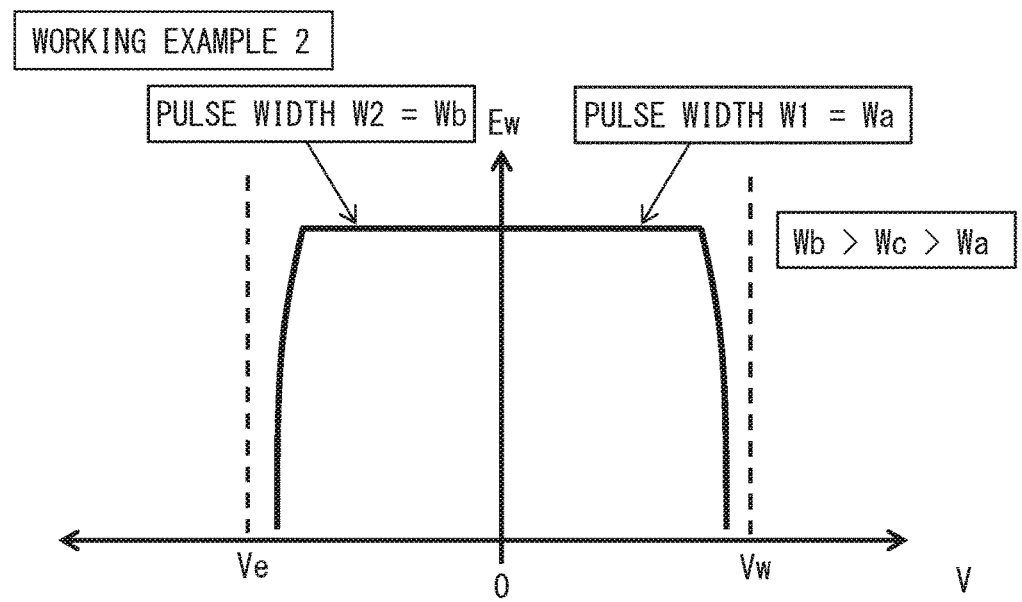

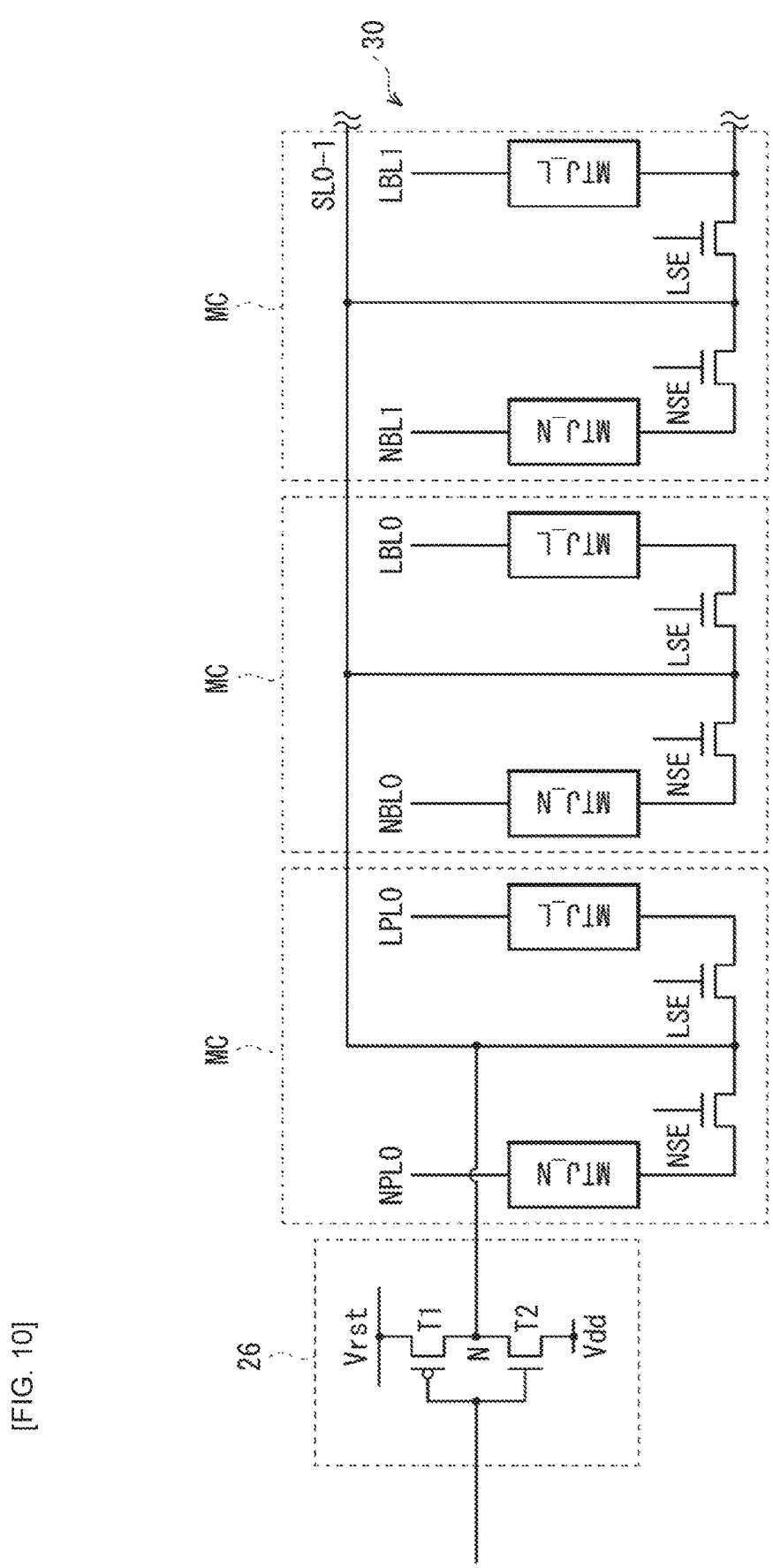
[FIG. 10]

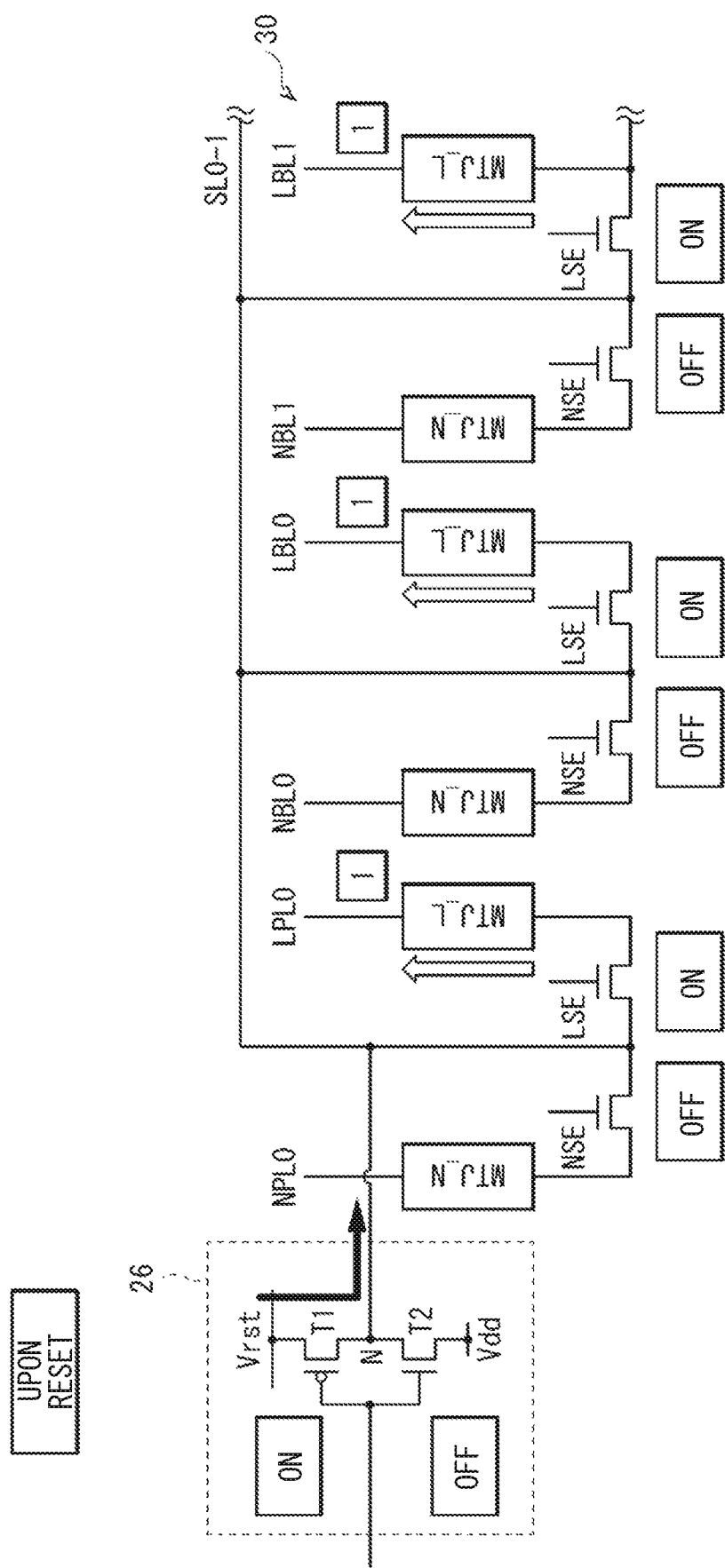
[FIG. 11]

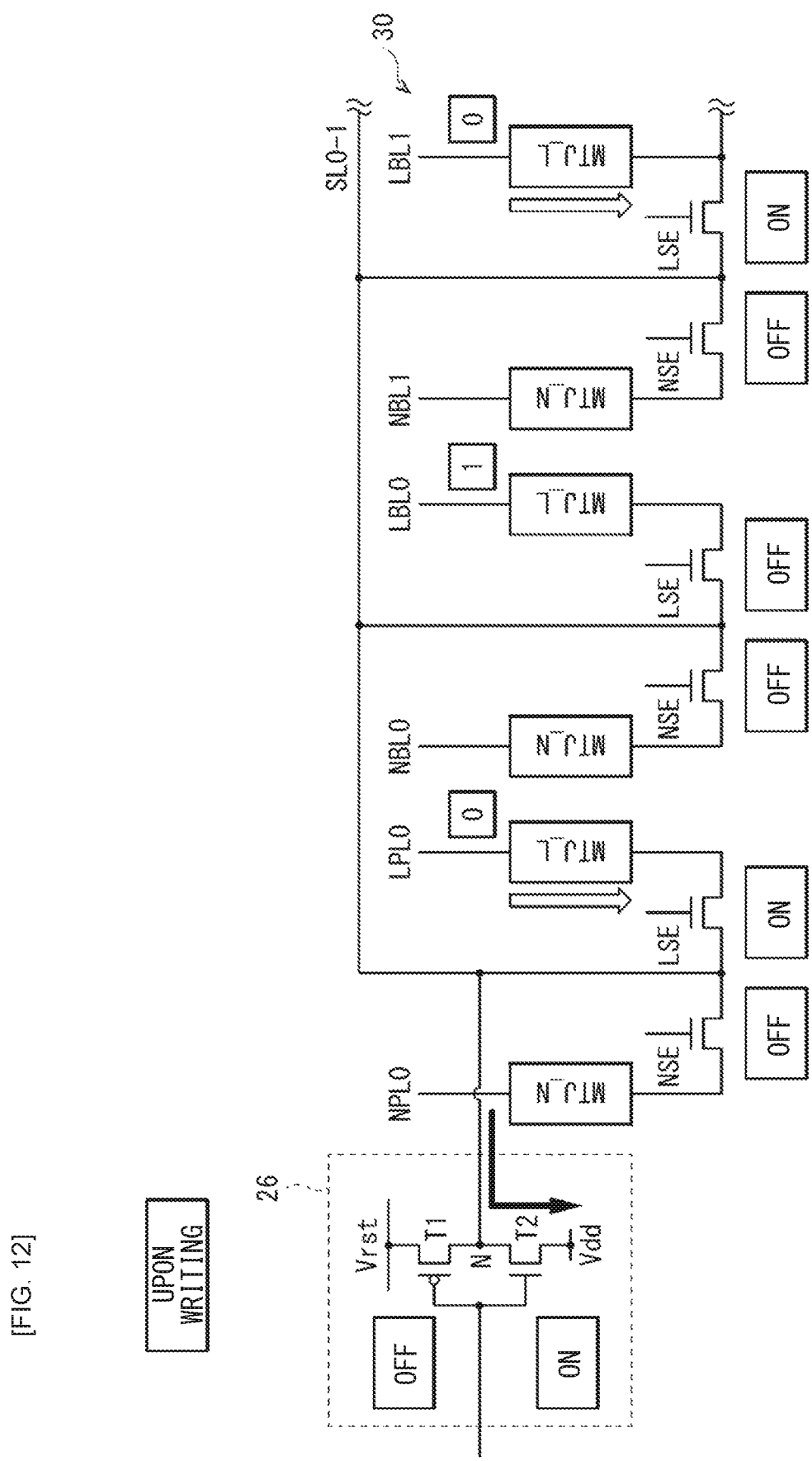
[FIG. 12]

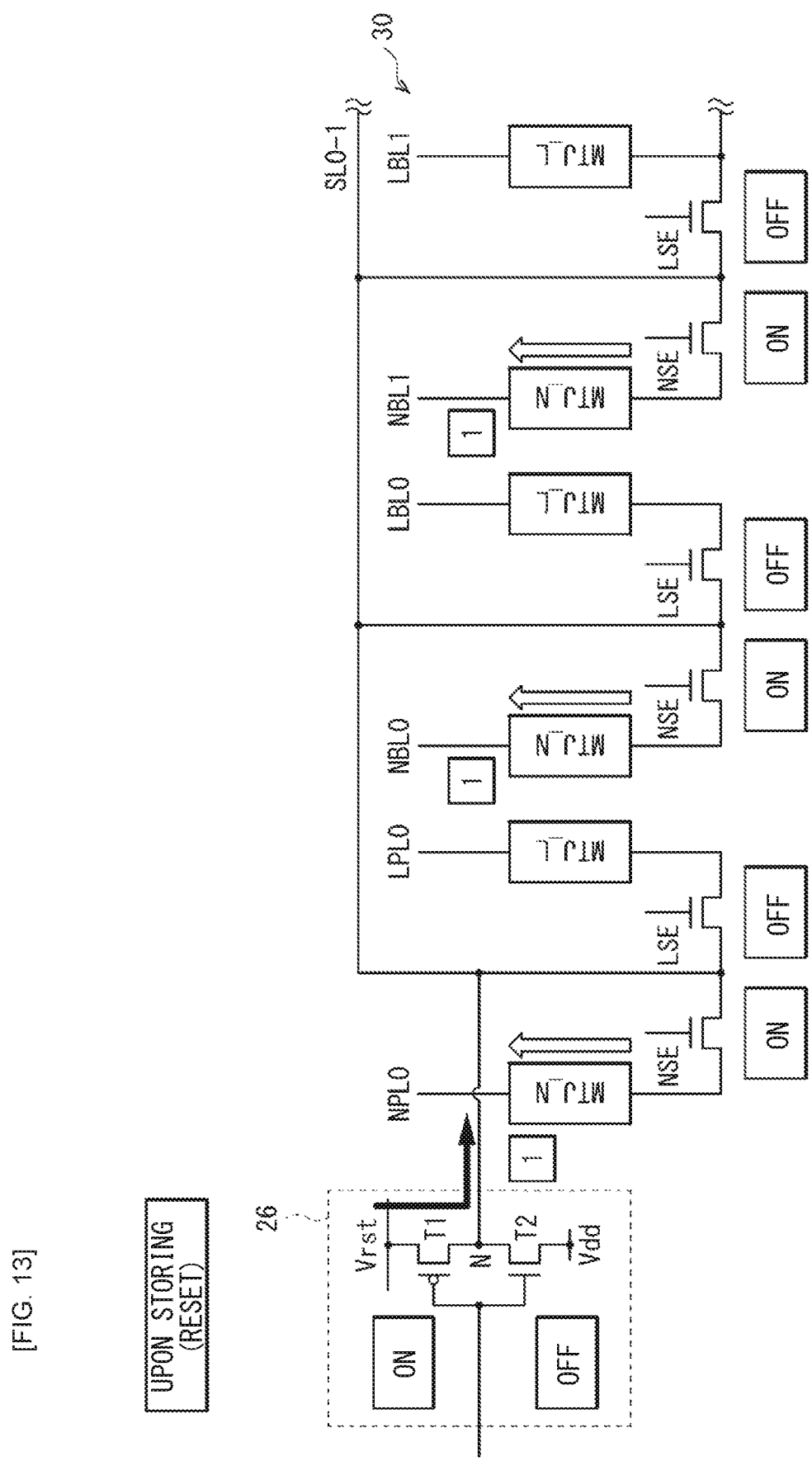
[FIG. 13]

[FIG. 14]
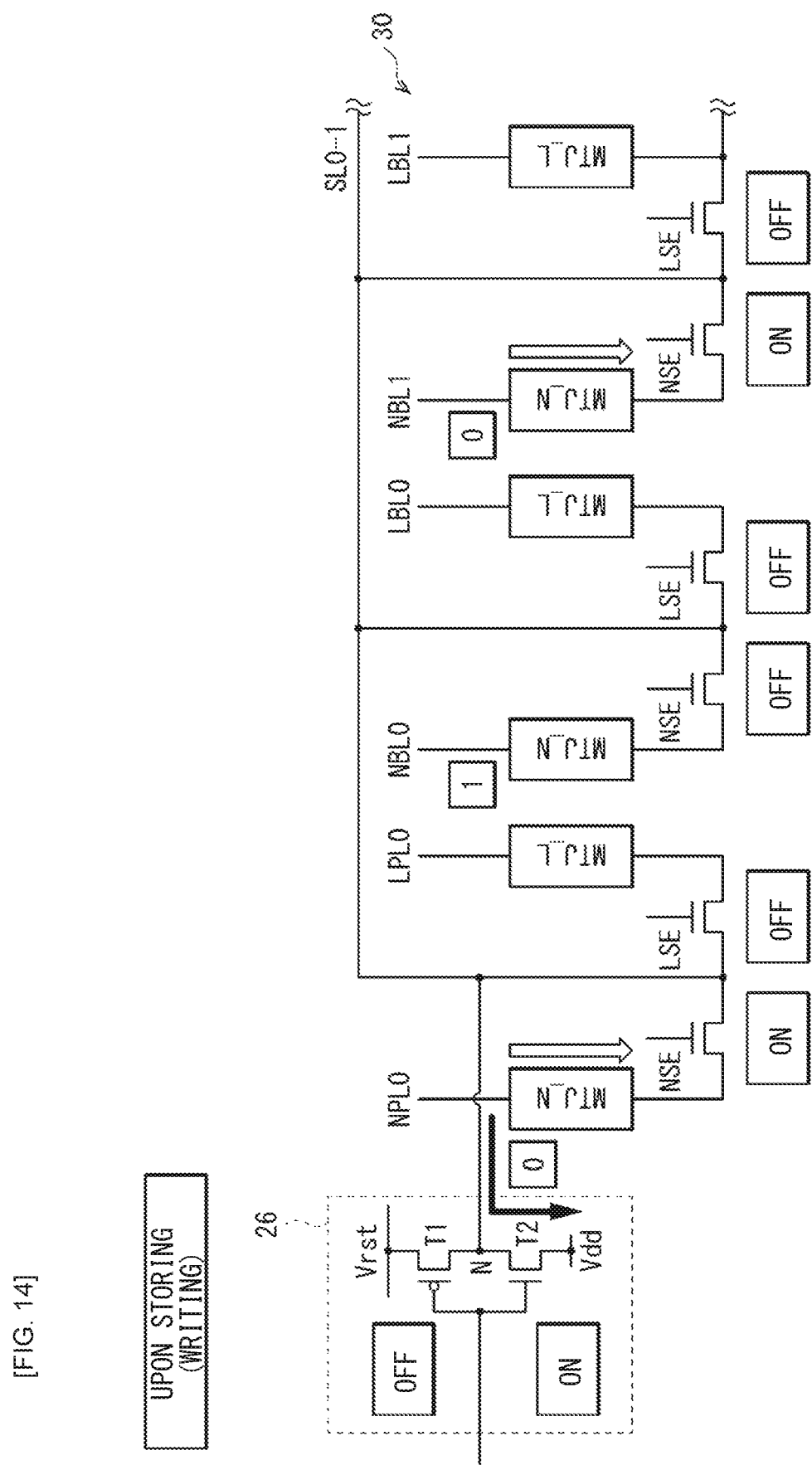

[FIG. 15]
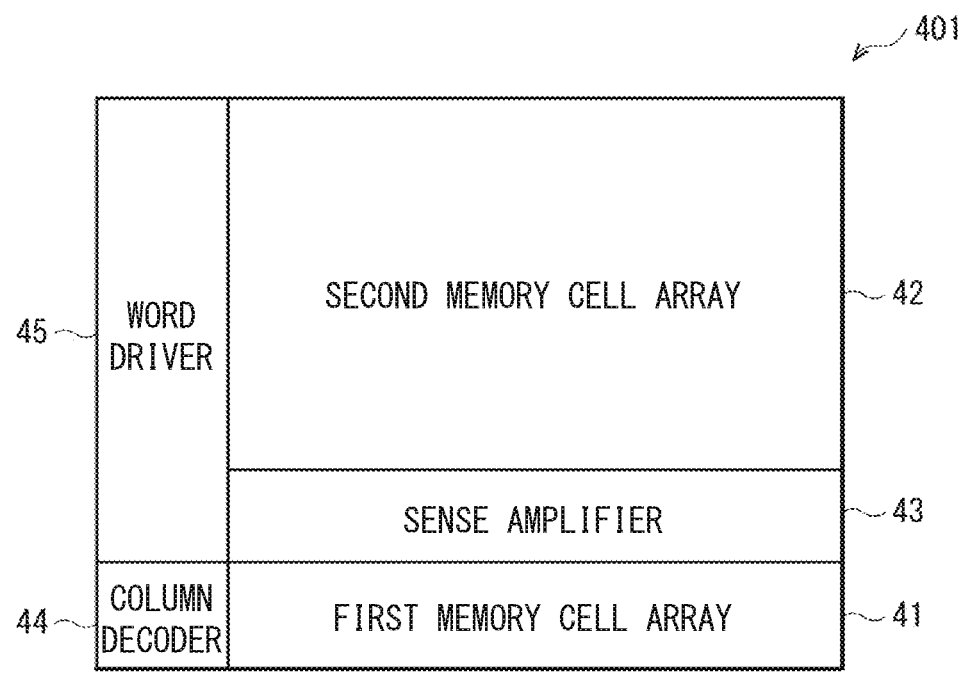

[FIG. 16A]
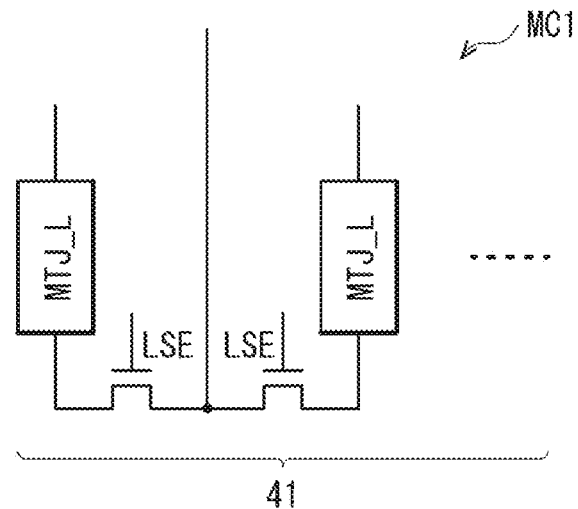
[FIG. 16B]
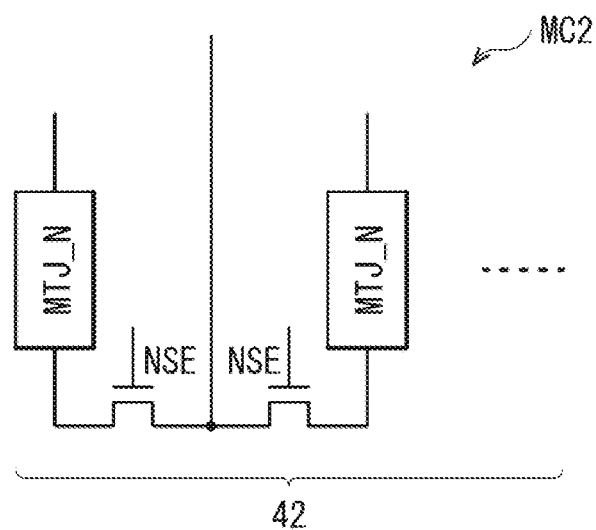

000# SEMICONDUCTOR STORAGE APPARATUS

CROSS REFERENCE TO RELATED APPLICATIONS

This application is a U.S. National Phase of International Patent Application No. PCT/JP2021/014824 filed on Apr. 7, 2021, which claims priority benefit of Japanese Patent Application No. JP 2020-188271 filed in the Japan Patent Office on Nov. 11, 2020 and also which claims priority benefit of Japanese Patent Application No. JP 2020-072873 filed in the Japan Patent Office on Apr. 15, 2020. Each of the above-referenced applications is hereby incorporated herein by reference in its entirety.

TECHNICAL FIELD

The present disclosure relates to a semiconductor storage apparatus.

BACKGROUND ART

STT-MRAM (Spin Transfer Torque Magnetic Random Access Memory) is known as a non-volatile memory. For the non-volatile memory such as the STT-MRAM, writing can sometimes succeed or writing can sometimes fail when the writing is executed on the same operating conditions. Measures for reducing such a writing error are described, for example, in Patent Literature 1.

CITATION LIST

Patent Literature

Patent Literature 1: Japanese Unexamined Patent Application Publication No. 2004-185754

SUMMARY OF THE INVENTION

Incidentally, in such a non-volatile memory, it has been demanded to further reduce a writing error. Accordingly, it is desirable to provide a semiconductor storage apparatus that makes it possible to further reduce a writing error.

A semiconductor storage apparatus according to one embodiment of the present disclosure includes a plurality of memory cells and a control circuit. Each of the memory cells includes a magnetization reversal memory device and a first switch device that controls a current to flow to the magnetization reversal memory device. The control circuit performs a writing control based on an asymmetric property of a writing error rate curve line with respect to a writing voltage of the magnetization reversal memory device.

In the semiconductor storage apparatus according to one embodiment of the present disclosure, the writing control based on the asymmetric property of the writing error rate curve line with respect to the writing voltage of the magnetization reversal memory device is performed. Thus, it is possible to reduce a writing error rate as compared with, for example, a case where a state change of the magnetization reversal memory device is performed by applying a voltage of a fixed pulse width to the magnetization reversal memory device.

BRIEF DESCRIPTION OF THE DRAWINGS

FIG. 1 is a diagram illustrating an example of a functional block of an information processing system according to an embodiment of the present disclosure.

FIG. 2 is a diagram illustrating an example of a functional block of a memory cell array unit of FIG. 1.

FIG. 3 is a diagram illustrating an example of a circuit configuration of a memory cell array of FIG. 2.

FIG. 4 is a diagram illustrating an example of a cross-sectional configuration of the memory cell array of FIG. 2 and an example of a circuit configuration of an erasure circuit of FIG. 2.

FIG. 5 is a diagram illustrating an example of a writing operation in the memory cell array and the erasure circuit of FIG. 4.

FIG. 6 is a diagram illustrating an example of an erasing operation in the memory cell array and the erasure circuit of FIG. 4.

FIG. 7 is a diagram illustrating an example of a writing error rate according to a comparative example.

FIG. 8 is a diagram illustrating an example of a writing error rate according to Working Example 1.

FIG. 9 is a diagram illustrating an example of a writing error rate according to Working Example 2.

FIG. 10 is a diagram illustrating an example of a configuration of a memory cell array and an erasure circuit according to a first modification example.

FIG. 11 is an explanatory diagram illustrating an example of operation of the memory cell array in a reset operation at the normal time.

FIG. 12 is an explanatory diagram illustrating an example of operation of the memory cell array in a writing operation at the normal time.

FIG. 13 is an explanatory diagram illustrating an example of operation of the memory cell array in the reset operation at the storing time.

FIG. 14 is an explanatory diagram illustrating an example of operation of the memory cell array in the writing operation at the storing time.

FIG. 15 is a diagram illustrating an example of a block configuration of a memory cell array unit according to a second modification example.

FIG. 16A is a diagram illustrating an example of a configuration of a first memory cell array of FIG. 15.

FIG. 16B is a diagram illustrating an example of a configuration of a second memory cell array of FIG. 15.

MODES FOR CARRYING OUT THE INVENTION

Hereinafter, an embodiment for practicing the present disclosure is described in detail with reference to the drawings. It should be noted that, in this specification and the accompanying drawings, components that have substantially the same functional configuration are indicated by the same reference signs, and thus redundant description thereof is omitted.

Embodiment

[Configuration]

FIG. 1 illustrates an example of a functional block of an information processing system according to an embodiment of the present disclosure. The information processing system includes a host computer 100 and a memory unit 200. The memory unit 200 includes a memory controller 300, one or more memory cell array units 400 and a power supply circuit 500. Note that FIG. 1 illustrates an example of a state in which one memory cell array unit 400 is provided. The memory cell array unit 400 corresponds to one specific example of a "semiconductor storage apparatus" according to the present disclosure.

(Host Computer 100)

The host computer 100 controls the memory unit 200. Specifically, the host computer 100 issues a command that specifies a logic address of an access destination and supplies the command and data to the memory unit 200. The host computer 100 receives the data outputted from the memory unit 200. Here, the command is for controlling the memory unit 200, and includes, for example, a write command that instructs a writing process of the data, a read command that instructs a reading process of the data, or a reset command that instructs an erasing process of the data. In addition, the logic address is an address allocated for each region of an access unit when the host computer 100 accesses the memory unit 200 in an address space defined by the host computer 100. The region of the access unit is hereinafter referred to as a "sector".

(Memory Controller 300)

The memory controller 300 controls one or more memory cell array units 400. The memory controller 300 receives, from the host computer 100, the write command that specifies the logic address. Further, the memory controller 300 executes a writing process of data in accordance with the write command. In the writing process, the logic address is converted into a physical address and the data is written to the physical address. Here, the physical address is an address allocated in one or more memory cell array units 400 for each access unit when the memory controller 300 accesses one or more memory cell array units 400. It is assumed that the memory controller 300 accesses one or more memory cell array units 400 in the same unit as the sector, for example. In this case, the physical address is allocated for each sector in one or more memory cell array units 400. In addition, when the memory controller 300 receives the read command that specifies the logic address, the memory controller 300 converts the logic address into the physical address and reads data from the physical address. Further, the memory controller 300 outputs, to the host computer 100, the thus read data as read data. In addition, when the memory controller 300 receives, from the host computer 100, the reset command that specifies the logic address, the memory controller 300 converts the logic address into the physical address and erases the data written in the physical address. The access unit by the memory controller 300 may be the same as or different from the access unit by the host computer 100.

(Power Supply Circuit 500)

The power supply circuit 500 supplies a desired voltage to one or more memory cell array units 400. Specifically, the power supply circuit 500 supplies, to a bit line decoder 25 described later, a set voltage used at the time of writing, a sense voltage used at the time of reading, and a reset voltage used at the time of erasing. The power supply circuit 500 supplies, to a word line decoder 23 described later, a selection voltage used at the time of writing, at the time of reading, and at the time of erasing.

(Memory Cell Array Unit 400)

Next, the memory cell array unit 400 will be described. FIG. 2 illustrates an example of a functional block of the memory cell array unit 400. The memory cell array unit 400 is configured by, for example, a semiconductor chip. The memory cell array unit 400 includes, for example, a control circuit 10, a drive circuit 20, and a memory cell array 30. The control circuit 10 and the drive circuit 20 correspond to one specific example of a "control circuit" according to the present disclosure. The control circuit 10 exchanges the command, the write data, the read data, etc., with the memory controller 300. The control circuit 10 writes the data to the memory cell array 30 in accordance with the write command, and reads the data from the memory cell array 30 in accordance with the read command. In addition, the control circuit 10 erases the data at a predetermined location in the memory cell array 30 in accordance with the reset command.

(Memory Cell Array 30)

FIG. 3 illustrates an example of a circuit configuration of the memory cell array 30. The memory cell array 30 is a so-called STT-MRAM. The memory cell array 30 has n-number of sectors (n is an integer greater than or equal to 2). Each sector has a plurality of pieces of memory cells MC corresponding to a size of the sector. Further, the physical address is allocated for each sector. The sector corresponds to one specific example of a "group" according to the present disclosure. The memory cell MC includes a magnetization reversal memory device MTJ and a selection device SE that controls a current to flow to the magnetization reversal memory device MTJ. The magnetization reversal memory device MTJ corresponds to one specific example of a "magnetization reversal memory device" according to the present disclosure. The selection device SE corresponds to one specific example of a "first switch device" according to the present disclosure.

The magnetization reversal memory device MTJ is, for example, a memory device that includes a magnetic tunnel junction. The magnetization reversal memory device MTJ has, for example, a fix layer (RL) and a free layer (FL), and has an extremely thin tunnel insulation film layer between the fix layer (RL) and the free layer (FL). In the magnetization reversal memory device MTJ, by changing a direction of magnetization of the free layer (FL), the stored data (an electrical resistance value) is rewritten. In the magnetization reversal memory device MTJ, when a direction of magnetization of the free layer (FL) is changed, electrons whose orientations of spin are uniform are injected into the magnetization reversal memory device MTJ. Because the spin of the injection electrons is opposite to the electron spin of the free layer (FL), a torque based on the spin of the injection electrons becomes the torque that moves the electron spin of the free layer (FL), and finally, an orientation of the electron spin of the free layer (FL) is reversed (a magnetization reversal).

The memory cell array 30 has, for example, a plurality of word lines WL, a plurality of bit lines BL, a plurality of memory cells MC disposed one by one for each position where the word line WL and the bit line BL face each other, and a plurality of source lines SL. The source line SL corresponds to one specific example of a "wiring line" according to the present disclosure. FIG. 3 illustrates an example in which the memory cells MC are disposed at intersections of three bit lines BL0, BL1, and BL2 and three word lines WL0, WL1, and WL2. Further, FIG. 3 illustrates an example in which three source lines SL0, SL1, and SL2 are disposed one by one for each memory cell row. It should be noted that the arrangement and the number of bit lines BL, the word lines WL, the memory cells MC, and the source line SL are not limited to the illustrated example.

It is possible for the memory cell array 30 to write data to the memory cell MC specified by an external address input. Further, it is possible to read data stored in the memory cell MC specified by the address input. A data value stored in the memory cell MC is distinguished by a resistance state of the magnetization reversal memory device MTJ. For example, if it is a high resistance state, it is distinguished as "0" and if it is a low resistance state, it is distinguished as "1". "0" or the high resistance state corresponds to one specific example of a "first state" according to the present disclosure. "1" or the low resistance state corresponds to one specific example of a "second state" according to the present disclosure.

(Drive Circuit 20)

Next, the drive circuit 20 will be described. When erasing the data, the drive circuit 20 does not collectively perform an erasing operation on all of the memory cells MC included in the memory cell array 30, but performs the erasing operation collectively on predetermined memory cells MC included in the memory cell array 30. Specifically, the plurality of memory cells MC included in the memory cell array 30 is divided into a plurality of groups, and the drive circuit 20 determines the necessity of the erasing operation for each divided group. For example, the drive circuit 20 determines whether or not the erasing operation (the writing of the second state) for each group is necessary, on the basis of the state (the resistance state) of the magnetization reversal memory device MTJ included in one memory cell MC in each group. The drive circuit 20 collectively performs the erasing operation on only one or a plurality of groups in which the erasing operation is determined as being necessary, for example.

The drive circuit 20 has, for example, as illustrated in FIG. 2, a timing control circuit 21, a voltage control circuit 22, a word line decoder 23, a voltage control circuit 24, a bit line decoder 25, and an erasure circuit 26.

The timing control circuit 21 outputs, to the voltage control circuits 22 and 24, a signal that controls a timing of changing an output voltage. The timing control circuit 21 sets the output voltage of the voltage control circuit 22 to a selection voltage used at the time of writing, at the time of reading, and at the time of erasing by setting a first control signal to high, for example. The timing control circuit 21 sets the output voltage of the voltage control circuit 22 to a common voltage used at the time of non-writing, at the time of non-reading, and at the time of non-erasing by setting the first control signal to low, for example. The timing control circuit 21 sets the output voltage of the voltage control circuit 24 to the set voltage (a writing voltage Vw) used at the time of writing by causing the second control signal and a third control signal to be high, for example. The timing control circuit 21 sets the output voltage of the voltage control circuit 24 to the common voltage used at the time of non-writing, at the time of non-reading, and at the time of non-erasing by causing the second control signal to be high and causing the third control signal to be low, for example. The timing control circuit 21 sets the output voltage of the voltage control circuit 24 to the reset voltage (an erasing voltage Ve) used at the time of erasing by causing the second control signal and the third control signal to be low, for example.

The voltage control circuit 22 includes a circuit that drives to a predetermined voltage (a selection voltage) necessary for operations of the writing, the reading, and the erasing when performing the operations of the writing, the reading, and the erasing.

The word line decoder 23 is coupled to each word line WL of the memory cell array 30, and selects the corresponding word line WL in accordance with a row address inputted from an address line. The word line WL selected by the word line decoder 23 is referred to as a selection word line, and all of the word lines WL not selected by the word line decoder 23 are referred to as non-selection word lines.

The voltage control circuit 24 includes a circuit that drives the word line WL to which data "1" is to be written to a predetermined voltage (the erasing voltage Ve) necessary for the reset operation, when performing an operation of writing the data "1", i.e., performing the writing (reset) operation that changes the magnetization reversal memory device MTJ of the memory cell MC from the high resistance state to the low resistance state. That is, the voltage control circuit 24 performs the erasing of the data on the memory cell MC by changing the magnetization reversal memory device MTJ from the high resistance state to the low resistance state. Further, the voltage control circuit 24 includes a circuit that drives the word line WL to which data "0" is to be written to a predetermined voltage (the writing voltage Vw) necessary for the set operation, when performing an operation of writing the data "0", i.e., performing the writing (set) operation that changes the magnetization reversal memory device MTJ of the memory cell MC from the low resistance state to the high resistance state. That is, the voltage control circuit 24 performs the writing of the data stored in the memory cell MC by changing the magnetization reversal memory device MTJ from the low resistance state to the high resistance state.

The bit line decoder 25 is coupled to each bit line BL of the memory cell array 30, and selects the corresponding bit line BL in accordance with a column address inputted from an address line. The bit line BL selected by the bit line decoder 25 is referred to as a selection bit line, and all of the word lines WL not selected by the bit line decoder 25 are referred to as non-selection bit lines.

One erasure circuit 26 is provided for each group described above. The erasure circuit 26 includes a circuit that drives the source line SL to which data "1" is to be written to a predetermined voltage (an erasing voltage Vrst (e.g., 0 V)) necessary for the reset operation when performing the reset operation. Further, the erasure circuit 26 includes a circuit that drives to a predetermined voltage (a common voltage Vdd (e.g., 1.1 V)) necessary for the set operation and the reading operation when performing the set operation and the reading operation. The erasure circuit 26 includes, for example, as illustrated in FIG. 4, a p-type MOS transistor T1 and an n-type MOS transistor T2. At this time, the p-type MOS transistor T1 and the n-type MOS transistor T2 are coupled to each other in series, and gates of the p-type MOS transistor T1 and the n-type MOS transistor T2 are coupled to each other. A node N in which a source or a drain of the p-type MOS transistor T1 and a source or a drain of the n-type MOS transistor T2 are coupled to each other is coupled to the source line SL.

Here, the plurality of source lines SL is provided one by one for each group described above. Each source line SL is coupled to the selection device SE of each memory cell MC of the corresponding group and to the node N of the erasure circuit 26. One memory cell MC in each group described above is used for determining the necessity of the erasing operation (the writing of the second state) for each group, and the selection device SE (hereinafter referred to as a selection device "PB") included in this memory cell MC is coupled to a parity bit line PL which is one type of the bit line BL. For example, as illustrated in FIG. 4, the plurality of memory cells MC to which a parity bit line PL0 and bit lines BL0 to BLk are coupled constitute one group, and one source line SL0-1 is provided for this group. The source line SL0-1 is coupled to the selection devices SE and PB of each memory cell MC included in this group and to the node N of the erasure circuit 26 provided corresponding to this group.

For example, as illustrated in FIG. 4, the plurality of memory cell MC is formed on a semiconductor substrate 31. The semiconductor substrate 31 has an n-semiconductor layer 33 and has a pwell layer 35 for each group. Each pwell layer 35 is formed in an n-semiconductor layer 34 provided for each group.

[Writing Operation]

Next, referring to FIG. 5, an example of the writing operation will be described. In each of the erasure circuits, the drive circuit 20 turns off the p-type MOS transistor T1, turns on the n-type MOS transistor T2, turns on one or more selection devices SE coupled to the selection bit line, and turns on the selection device PB of the group corresponding to the selection bit line. This causes "0" to be written to one or more magnetization reversal memory devices MTJ coupled to the selection bit line and to the magnetization reversal memory device MTJ coupled to the selection device PB of the group corresponding to the selection bit line. Thus, the drive circuit 20 writes "0" to the magnetization reversal memory device MTJ coupled to the selection device PB of the group corresponding to the selection bit line. Here, in a case where the memory cell array unit 400 is used as the frame memory, the drive circuit 20 performs the writing operation in a writing period (a period between a blanking period of an n−1 frame period and a blanking period of an n frame period).

[Erasing Operation]

Next, referring to FIG. 6, an example of the erasing operation will be described. First, in each of the erasure circuits 26, the drive circuit 20 turns off the p-type MOS transistor T1, turns on the n-type MOS transistor T2, and turns on the selection device PB of each group to read the state of the magnetization reversal memory device MTJ coupled to the selection device PB of each group. Next, in the erasure circuit 26 corresponding to the group in which the state of the magnetization reversal memory device MTJ coupled to the selection device PB is "0", the drive circuit 20 turns on the p-type MOS transistor T1, turn off the n-type MOS transistor T2, and turns on the selection devices SE and PB of all of the memory cells MC of the group in which the state of the magnetization reversal memory device MTJ coupled to the selection device PB is "0". This causes "1" to be written to the magnetization reversal memory devices MTJ of all of the memory cells MC of the group in which the state of the magnetization reversal memory device MTJ is "0". Thus, the drive circuit 20 does not perform the erasing operation on all of the memory cells MC, but performs the erasing operation only for the memory cell MC included in the group in which the state of the magnetization reversal memory device MTJ coupled to the selection device PB is "0". Here, in a case where the memory cell array unit 400 is used as the frame memory, the drive circuit 20 performs the erasing operation in the blanking period.

Incidentally, the drive circuit 20 performs a writing control based on an asymmetric property of a writing error rate curve line with respect to a writing voltage of the magnetization reversal memory device MTJ in the above-described writing operation and the above-described erasing operation. Assume that a curve line of a writing error rate Ew obtained in a case where the state change of the magnetization reversal memory device MTJ is performed by applying a voltage of a fixed pulse width (a pulse width W=Wc) to the selection bit line (the magnetization reversal memory device MTJ) is as illustrated in a comparative example of FIG. 7, for example. Thus, it is assumed that the curve line of the writing error rate Ew is asymmetric with respect to the writing voltage in a case where the voltage of the fixed pulse width (the pulse widths W=Wc) is applied to the selection bit line (the magnetization reversal memory device MTJ). At this time, when the erasing voltage Ve of a magnitude set by specifications is applied to the selection bit line (the magnetization reversal memory device MTJ), the writing error rate Ew becomes extremely large.

Therefore, in the present embodiment, the drive circuit 20 may apply a voltage of a wide pulse width (a pulse width W=Wb>Wc) as compared with the above-described comparative example by controlling an ON period of the selection device SE in the above-mentioned writing operation and the above-mentioned erasing operation. As described above, it is assumed that the curve line of the writing error rate Ew obtained in a case where the state change of the magnetization reversal memory device MTJ is performed by applying the voltage of the wider pulse width (the pulse width W=Wb>Wc) than the above-described comparative example to the selection bit line (the magnetization reversal memory device MTJ) is as illustrated in Working Example 1 of FIG. 8, for example. In this case as well, similar to the comparative example described above, the curve line of the writing error rate Ew is asymmetric with respect to the writing voltage. However, in this case, when the erasing voltage Ve of a magnitude set by specifications is applied to the selection bit line (the magnetization reversal memory device MTJ), the writing error rate Ew may be as small as when the writing voltage Vw of the magnitude set by specifications is applied. Accordingly, the drive circuit 20 may set the pulse widths of the writing voltage Vw and the erasing voltage Ve of the magnitudes set by the specifications to be wider such that the writing error rate Ew when the erasing voltage Ve of the magnitude set by the specifications is applied is as small as when the writing voltage Vw of the magnitude set by the specifications is applied.

In the above writing operation, the drive circuit 20 may apply the writing voltage Vw of a narrower pulse width (a pulse width W1=Wa<Wc) than the above comparative example, and in the above erasing operation, the drive circuit 20 may apply the erasing voltage Ve of a wider pulse width (a pulse width W2=Wb>Wc) than the above comparative example. As described above, assume that the curve line of the writing error rate Ew obtained in a case where the state change of the magnetization reversal memory device MTJ is performed by applying, to the selection bit line (the magnetization reversal memory device MTJ), the writing voltage Vw of the narrower pulse width (the pulse width W1=Wa<Wc) in the above-mentioned writing operation and by applying, to the selection bit line (the magnetization reversal memory device MTJ), the erasing voltage Ve of the wider pulse width (the pulse width W2=Wb>Wc) than the above-mentioned comparative example in the above-mentioned erasing operation is as illustrated in Working Example 2 of FIG. 9, for example. In this case, unlike the comparative example described above, the curve line of the writing error rate Ew is substantially symmetrical with respect to the writing voltage. At this time, when the writing voltage Vw of the magnitude set by the specifications or the erasing voltage Ve of the magnitude set by the specifications is applied to the selection bit line (the magnetization reversal memory device MTJ), the writing error rate Ew can both be extremely small. Thus, the drive circuit 20 may perform the writing control in which the pulse width (the pulse width W1=Wa) of the writing voltage Vw of the magnitude set by the specifications and the pulse width (the pulse width W2=Wb) of the erasing voltage Ve of the magnitude set by the specifications are made different from each other such that the writing error rate Ew becomes extremely small when the writing voltage Vw and the erasing voltage Ve are applied. Specifically, the drive circuit 20 performs the writing control to cause the pulse width (the pulse width W1=Wa) of the writing voltage Vw of the magnitude set by the specifications to be smaller than the pulse width (the pulse width W2=Wb) of the erasing voltage Ve of the magnitude set by the specifications such that the writing error rate Ew becomes extremely small when the writing voltage Vw of the magnitude set by the specifications and the erasing voltage Ve of the magnitude set by the specifications are applied.

[Effects]

Next, effects of the information processing system according to one embodiment of the present disclosure will be described.

In the present embodiment, the writing control based on the asymmetric property of the writing error rate curve line with respect to the wiring voltage of the magnetization reversal memory device MTJ is performed. Thus, it is possible to reduce the writing error rate as compared with, for example, a case (for example, a case of the comparative example described above) where the state change of the magnetization reversal memory device MTJ is performed by applying the voltage of the fixed pulse width to the magnetization reversal memory device MTJ. Therefore, it is possible to provide an information processing system in which a writing error is further reduced.

In the present embodiment, the writing control is performed in which the pulse width (the pulse width W1=Wa) of the writing voltage Vw and the pulse width (the pulse width W2=Wb) of the erasing voltage Ve are made different from each other by controlling an ON period of the selection device SE in the above-described writing operation and the above-described erasing operation. As a result, for example, by performing the writing control such that the pulse width (the pulse width W1=Wa) of the writing voltage Vw becomes smaller than the pulse width (the pulse width W2=Wb) of the erasing voltage Ve, it becomes possible to reduce the writing error rate as compared with the above-described comparative example, for example. Therefore, it is possible to provide an information processing system in which the writing error is further reduced.

In the present embodiment, the above-described writing operation is performed during the writing period (the period between the blanking period of the n−1 frame period and the blanking period of the n frame period), and the above-described erasing operation is performed in the blanking period. At this time, for example, by performing the writing control such that the pulse width (the pulse width W1=Wa) of the writing voltage Vw becomes smaller than the pulse width (the pulse width W2=Wb) of the erasing voltage Ve, it is possible to reduce the writing error rate as compared with the comparative example described above and to perform a high-speed operation, for example.

In the present embodiment, the plurality of memory cells MC included in the memory cell array 30 is divided into the plurality of groups, and the necessity of the erasing operation (the writing of the second state) for each group is determined on the basis of the state (the resistance state) of the magnetization reversal memory device MTJ included in one memory cell MC in each group. Thus, for example, as compared with a case where the erasing operation is performed on all of the memory cells MC included in the memory cell array 30, it is possible to reduce a wasteful erasing operation and to achieve a low power consumption.

In the present embodiment, the source line SL and the erasure circuit 26 that controls supplying, to the source line SL, of the voltage to be used upon performing the above-described erasing operation are provided for each group. Thus, it is possible to perform the above-described erasing operation selectively for the group in which the erasing operation (the writing of the second state) is determined as being necessary. Therefore, for example, as compared with a case where the erasing operation is performed on all of the memory cells MC included in the memory cell array 30, it is possible to reduce a wasteful erasing operation and to achieve a low power consumption.

First Modification Example

[Configuration]

Next, a first modification example of the information processing system according to one embodiment of the present disclosure will be described. FIG. 10 is a diagram illustrating an example of a configuration of a memory cell array and an erasure circuit included in the information processing system according to the present modification example.

As illustrated in FIG. 10, a memory cell array 30 included in the information processing system according to the present modification example includes a plurality of memory cells MC and an erasure circuit 26.

In the present modification example, each memory cell MC includes a plurality of magnetization reversal memory devices. Specifically, each of the memory cells MC includes magnetization reversal memory devices MTJ_N and MTJ_L provided in parallel and selection devices NSE and LSE respectively coupled to the magnetization reversal memory devices MTJ_N and MTJ_L.

For example, the magnetization reversal memory devices MTJ_N and MTJ_L are each a memory device including a magnetic tunnel junction. The magnetization reversal memory devices MTJ_N and MTJ_L each include, for example, a fix layer in which an orientation of magnetization is fixed, a free layer in which the orientation of magnetization is variably provided, and an extremely thin tunnel insulation film layer provided between the fix layer and the free layer.

The selection devices NSE and LSE control currents to flow to the respective magnetization reversal memory devices MTJ_N and MTJ_L. Specifically, the selection device NSE controls the current that flows to the magnetization reversal memory device MTJ_N, and the selection device LSE controls the current that flows to the magnetization reversal memory device MTJ_L.

In the memory cell array 30, data is written to the memory cell MC specified by the external address input, and the data stored in the memory cell MC specified by the address input is read out. At this time, in each of the memory cells MC, writing and reading of the data is performed on one of the magnetization reversal memory devices MTJ_N and MTJ_L. A data value stored in the memory cell MC is distinguished by resistance states of the magnetization reversal memory devices MTJ_N and MTJ_L. For example, if the magnetization reversal memory devices MTJ_N and MTJ_L are each a high resistance state, it is distinguished as "0", and if the magnetization reversal memory devices MTJ_N and MTJ_L are each a low resistance state, it is distinguished as "1".

Here, the magnetization reversal memory devices MTJ_N and MTJ_L are provided so as to be different in characteristics from each other. Specifically, the magnetization reversal memory devices MTJ_N and MTJ_L may be provided so as to be different in data retaining characteristics from each other. That is, the magnetization reversal memory devices MTJ_N and MTJ_L may be provided so as to be different from each other in reversibility of magnetization directions of the free layers, or retaining characteristics of the magnetization directions of the fix layer and the free layers. For example, the magnetization reversal memory device MTJ_L may be provided such that data retaining characteristics become lower than those of the magnetization reversal memory device MTJ_N.

The magnetization reversal memory devices MTJ_N and MTJ_L make it possible to make the data retaining characteristics different from each other by, for example, providing at least one or more of formation materials or sizes of devices to be different from each other. In such a case, the magnetization reversal memory devices MTJ_N and MTJ_L may be provided such that heights of layers to be formed become different from each other. Thus, the magnetization reversal memory devices MTJ_N and MTJ_L make it possible to individually control the formation size or the size of the device that controls the retaining characteristics.

It is possible for the information processing system according to the present modification example to change characteristics of the memory cell array 30 depending on applications by controlling which of the plurality of magnetization reversal memory devices MTJ_N and MTJ_L that are different from each other in the data retaining characteristics stores the data. Specifically, because it is possible for the information processing system according to the present modification example to operate at higher speed and lower power by performing the writing and the reading of the data using the magnetization reversal memory device MTJ_L, which has low data retaining characteristics and in which the writing of the data is easy, it is possible to suitably use it for a frame memory application or the like. Further, because it is possible for the information processing system according to the present modification example to store the data at a higher non-volatility by storing the data using the magnetization reversal memory device MTJ_N in which the data retaining characteristics are high, it is possible to use it for a data storage application or the like.

The plurality of memory cells MC included in the memory cell array 30 is divided into a plurality of groups, and the erasure circuit 26 is provided for each of the divided groups. In the information processing system according to the present modification example, the necessity of the erasing operation is determined for each of the divided groups, on the basis of states (resistance states) of the magnetization reversal memory devices MTJ_N and MTJ_L included in a predetermined memory cell MC (that is, a parity bit) in each group. The erasing operation (the reset operation) is executed collectively for one or more groups in which the erasing operation is determined as being necessary.

For example, as illustrated in FIG. 10, parity bit lines NPL0 and LPL0 and bit lines NBL0, LBL0, NBL1, and LBL1 are coupled to the plurality of memory cells MC constituting one group, and one source line SL0-1 is coupled thereto. Specifically, the parity bit line NPL0 and the bit lines NBL0 and NBL1 are coupled to the magnetization reversal memory device MTJ_L in which the data retaining characteristics are lower than those of the magnetization reversal memory device MTJ_N, and the parity bit line LPL0 and the bit lines LBL0 and LBL1 are coupled to the magnetization reversal memory device MTJ_N in which the data retaining characteristics are higher than those of the magnetization reversal memory device MTJ_L. The source line SL0-1 is coupled to the selection devices NSE and LSE of each memory cell MC included in the group, and is coupled to the node N of the erasure circuit 26 corresponding to the group.

The erasure circuit 26 includes the p-type MOS transistor T1 and the n-type MOS transistor T2. The p-type MOS transistor T1 and the n-type MOS transistor T2 are coupled in series with each other. A gate of the p-type MOS transistor T1 and a gate of the n-type MOS transistor T2 are coupled to each other, and one of a source and a drain of the p-type MOS transistor T1 and one of a source and a drain of the n-type MOS transistor T2 are coupled to each other at the node N. In addition, the node N is coupled to the source line SL0-1.

As a result, it is possible for the erasure circuit 26 to apply, to the source line SL0-1, a predetermined voltage (the erasing voltage Vrst (e.g., 0 V)) necessary for the reset operation when performing the reset operation. In addition, it is possible for the erasure circuit 26 to apply, to the source line SL0-1, a predetermined voltage (the common voltage Vdd (e.g., 1.1 V)) necessary for the writing operation and the reading operation when performing the writing operation and the reading operation.

[Operation]

Next, referring to FIGS. 11 to 14, an exemplary operation of the information processing system according to the present modification example will be described. FIG. 11 is an explanatory diagram illustrating an example of operation of the memory cell array 30 in the reset operation at the normal time. FIG. 12 is an explanatory diagram illustrating an example of operation of the memory cell array 30 in the writing operation at the normal time. FIG. 13 is an explanatory diagram illustrating an example of operation of the memory cell array 30 upon resetting at the storing time. FIG. 14 is an explanatory diagram illustrating an example of operation of the memory cell array 30 upon writing at the storing time.

The information processing system according to the present modification example may be used, for example, as a frame memory. It is possible for the information processing system according to the present modification example to operate at higher speed and lower power by writing the data to the magnetization reversal memory device MTJ_L in which the data retaining characteristics are low at the normal operation time. Further, it is possible for the information processing system according to the present modification example to store the data at higher non-volatility by writing the data to the magnetization reversal memory device MTJ_N in which the data retaining characteristics are high at the time of storing data such as before sleep. In the following, an operation of the information processing system according to the present modification example will be described in detail while dividing the operation into the normal operation time and the storing time.

(At Normal Operation Time)

As illustrated in FIG. 11, in the reset operation at the normal time, the p-type MOS transistor T1 of the erasure circuit 26 is controlled to be in an ON state, and the n-type MOS transistor T2 is controlled to be in an OFF state. In addition, the selection devices LSE of all of the memory cells MC of the group are controlled to be in an ON state. This causes "1" to be written to the magnetization reversal memory device MTJ_L of all of the memory cells MC in the group.

In addition, as illustrated in FIG. 12, in the writing operation at the normal time, the p-type MOS transistor T1 of the erasure circuit 26 is controlled to be in an OFF state, and the n-type MOS transistor T2 is controlled to be in an ON state. Further, the selection device LSE coupled to the selected bit line LBL1 and the selection device LSE coupled to the parity bit line LPL0 are controlled to be in an ON state. This causes "0" to be written to the magnetization reversal memory device MTJ_L coupled to the selected bit line LBL1 and the magnetization reversal memory device MTJ_L coupled to the parity bit line LPL0.

It is possible for the information processing system according to the present modification example to determine whether or not the data is written to the memory cell MC of the group by referring to the data stored in the magnetization reversal memory device MTJ_L coupled to the parity bit line LPL0. Therefore, it is possible for the information processing system according to the present modification example to determine whether or not to perform the reset operation on the memory cell MC of the group, on the basis of the data stored in the magnetization reversal memory device MTJ_L coupled to the parity bit line LPL0.

According to the above operation, it is possible for the information processing system according to the present modification example to operate at higher speed and lower power by performing the writing and the reading of the data on the magnetization reversal memory device MTJ_L in which the data retaining characteristics are lower than the magnetization reversal memory device MTJ_N.

(At Storing Time)

As illustrated in FIG. 13, in the reset operation at the time of storing such as before sleep, the p-type MOS transistor T1 of the erasure circuit 26 is controlled to be in an ON state, and the n-type MOS transistor T2 is controlled to be in an OFF state. In addition, the selection devices NSE of all of the memory cells MC of the group are controlled to be in an ON state. This causes "1" to be written to the magnetization reversal memory devices MTJ_N of all of the memory cells MC in the group.

Next, the p-type MOS transistor T1 of the erasure circuit 26 is controlled to be in an OFF state and the n-type MOS transistor T2 is controlled to be in an ON state. The state of the magnetization reversal memory device MTJ_L coupled to each of the selection devices LSE is read by controlling each of the selection devices LSE of the memory cells MC to be in the ON state.

Thereafter, as illustrated in FIG. 14, in the writing operation at the time of storing, the p-type MOS transistor T1 of the erasure circuit 26 is controlled to be in an OFF state, and the n-type MOS transistor T2 is controlled to be in an ON state. In addition, the selection device NSE coupled to the bit line NBL1 of the memory cell MC in which "0" is written to the magnetization reversal memory device MTJ_L and the selection device NSE coupled to the parity bit line NPL0 are controlled to be in an ON state. This causes "0" to be written to the magnetization reversal memory device MTJ_N coupled to the bit line NBL1 and the magnetization reversal memory device MTJ_N coupled to the parity bit line NPL0.

According to the above operation, it is possible for the information processing system according to the present modification example to store the data at a higher nonvolatility by writing the data to the magnetization reversal memory device MTJ_N that is higher in data retaining characteristics than the magnetization reversal memory device MTJ_L at the time of storing data such as before sleep.

Second Modification Example

[Configuration]

Next, a second modification example of an information processing system according to one embodiment of the present disclosure will be described. FIG. 15 is a diagram illustrating an example of a block configuration of a memory cell array unit 401 included in the information processing system according to the present modification example. FIG. 16A is a diagram illustrating an example of a configuration of a first memory cell array 41 of FIG. 15, and FIG. 16B is a diagram illustrating an example of a configuration of a second memory cell array 42 of FIG. 15.

As illustrated in FIG. 15, the memory cell array unit 401 included in the information processing system according to the present modification example includes a plurality of memory cell arrays. Specifically, the memory cell array unit 401 includes the first memory cell array 41, the second memory cell array 42, a sense amplifier 43, a column decoder 44, and a word driver 45.

The column decoder 44 and the word driver 45 control a memory cell to be activated in the first memory cell array 41 and the second memory cell array 42. Specifically, the column decoder 44 and the word driver 45 activate the memory cell selected from within the first memory cell array 41 and the second memory cell array 42 by selecting each of the word line arranged in a column direction and the bit line arranged in a row direction, on the basis of the inputted column address and the inputted row address.

The sense amplifier 43 determines whether the data stored in each of the memory cells is "0" or "1". Specifically, the sense amplifier 43 determines the data stored in each of the memory cells by determining the resistance state of the magnetization reversal memory device included in the memory cell. For example, the sense amplifier 43 may determine that the stored data is "0" in a case where the resistance state of the magnetization reversal memory device is the high resistance state, and may determine that the stored data is "1" in a case where the resistance state of the magnetization reversal memory device is the low resistance state.

As illustrated in FIG. 16A, the first memory cell array 41 includes a plurality of memory cells MC1. Each of the memory cells MC1 includes a plurality of magnetization reversal memory devices MTJ_L provided in series, and a plurality of selection devices LSE that controls a current to flow to each of the plurality of magnetization reversal memory devices MTJ_L.

In addition, as illustrated in FIG. 16B, the second memory cell array 42 includes a plurality of memory cells MC2. Each of the memory cells MC2 includes a plurality of magnetization reversal memory devices MTJ_N provided in series, and a plurality of selection devices NSE that controls a current to flow to each of the plurality of magnetization reversal memory devices MTJ_N.

Here, the magnetization reversal memory device MTJ_N included in the memory cell MC2 that configures the second memory cell array 42 is provided to be higher in the data retaining characteristics than the magnetization reversal memory device MTJ_L included in the memory cell MC1 that configures the first memory cell array 41. For example, by changing at least one or more of a formation material or a size of a device, the magnetization reversal memory device MTJ_N may be provided to be higher in the data retaining characteristics than the magnetization reversal memory device MTJ_L.

With this configuration, it is possible for the memory cell MC1 configuring the first memory cell array 41 to perform writing of the data at higher speed and lower power than the memory cell MC2 configuring the second memory cell array 42. On the other hand, it is possible for the memory cell MC2 configuring the second memory cell array 42 to store the data at a higher non-volatility than the memory cell MC1 configuring the first memory cell array 41.

In such a memory cell array unit 401, for example, by operating in the following manner, it is possible to achieve both the data rewriting at higher speed and higher non-volatility of the data holding.

Specifically, first, the memory cell array unit 401 temporarily holds the inputted data in the first memory cell array 41 operable at a higher speed. Next, after the data temporarily held in the first memory cell array 41 is determined by the sense amplifier 43, it is possible for the memory cell array unit 401 to store, in a non-volatile manner, the determined data in the second memory cell array 42 in which the non-volatility of the data is higher.

Therefore, it is possible for the memory cell array unit 401 according to the present modification example to store the data at a higher non-volatility while achieving the data rewriting at a higher speed by providing the first memory cell array 41 configured by the memory cell MC1 that includes the magnetization reversal memory device MTJ_L and the second memory cell array 42 configured by the memory cell MC2 that includes the magnetization reversal memory device MTJ_N in which the data retaining characteristics are higher than those of the magnetization reversal memory device MTJ_L.

Although the present disclosure has been described with reference to the embodiments and the modification examples thereof, the present disclosure is not limited to the above-described embodiments and the like, and various modifications can be made. In the above embodiment, the memory cell array 30 is the STT-MRAM. However, in the above embodiment, the memory cell array 30 may be MRAM different from the STT-MRAM, or may be a non-volatile memory different from the MRAM.

It should be noted that the effects described in this specification are only exemplary. The effects of the present disclosure are not limited to the effects described herein. The present disclosure may have effects other than the effects described herein.

For example, the present disclosure may also be configured as follows.

(1)

A semiconductor storage apparatus including:
 a plurality of memory cells each including a magnetization reversal memory device and a first switch device that controls a current to flow to the magnetization reversal memory device; and
 a control circuit that performs a writing control based on an asymmetric property of a writing error rate curve line with respect to a writing voltage of the magnetization reversal memory device.

(2)

The semiconductor storage apparatus according to (1), in which the control circuit performs the writing control in which Wa and Wb are made different from each other by controlling an ON period of the first switch device, where Wa is a pulse width upon writing a first state to the magnetization reversal memory device, and where Wb is a pulse width upon writing a second state to the magnetization reversal memory device.

(3)

The semiconductor storage apparatus according to (2), in which, where a pulse upon writing the first state to the magnetization reversal memory device is a first pulse and where a pulse upon writing the second state to the magnetization reversal memory device is a second pulse, the control circuit outputs the first pulse to the magnetization reversal memory device in a writing period, and outputs the second pulse to the magnetization reversal memory device in a blanking period.

(4)

The semiconductor storage apparatus according to (2) or (3), in which the control circuit performs the writing control to cause Wa to be smaller than Wb by controlling the ON period of the first switch device.

(5)

The semiconductor storage apparatus according to any one of (2) to (4), in which the control circuit divides the plurality of memory cells into a plurality of groups, and determines a necessity of the writing of the second state to each of the groups, on the basis of a state of the magnetization reversal memory device included in the single memory cell in each of the groups.

(6)

The semiconductor storage apparatus according to any one of (2) to (5),
 in which the plurality of memory cells is divided into a plurality of groups, and
 in which the semiconductor storage apparatus further includes:
 a plurality of wiring lines provided one by one for each of the groups, and coupled to the first switch device of each of the memory cells; and
 a plurality of second switch devices that is provided one by one for each of the wiring lines, and controls supplying, to the wiring lines, of a voltage to be used upon the writing of the second state to the magnetization reversal memory device.

(7)

The semiconductor storage apparatus according to any one of (1) to (6), in which each of the memory cells includes a plurality of the magnetization reversal memory devices, and a plurality of the first switch devices that controls the current to flow to each of the plurality of magnetization reversal memory devices.

(8)

The semiconductor storage apparatus according to (7), in which the plurality of magnetization reversal memory devices is different from each other in data retaining characteristic.

(9)

The semiconductor storage apparatus according to (8), in which the plurality of magnetization reversal memory devices is provided such that at least one or more of formation materials or sizes are different from each other.

(10)

The semiconductor storage apparatus according to (9), in which the plurality of magnetization reversal memory devices is provided such that heights of layers to be formed are different from each other.

(11)

The semiconductor storage apparatus according to any one of (1) to (10), in which
 the plurality of memory cells is divided into a plurality of memory cell arrays, and
 each of the memory cell arrays is configured by the memory cell that includes the magnetization reversal memory device in which a data retaining characteristic is different for each of the memory cell arrays.

(12)

The semiconductor storage apparatus according to (11), in which
- each of the memory cells includes a plurality of the magnetization reversal memory devices, and a plurality of the first switch devices that controls the current to flow to each of the plurality of magnetization reversal memory devices, and
- the plurality of magnetization reversal memory devices included in the same memory cell has the same data retaining characteristic.

(13)

The semiconductor storage apparatus according to (11) or (12), in which
- the plurality of memory cell arrays includes a first memory cell array that temporarily holds data inputted to the semiconductor storage apparatus, and a second memory cell array that stores, in a nonvolatile manner, the data temporarily held in the first memory cell array, and
- the data retaining characteristic of the magnetization reversal memory device included in the memory cell that configures the second memory cell array is higher than the data retaining characteristic of the magnetization reversal memory device included in the memory cell that configures the first memory cell array.

According to a semiconductor storage apparatus of one embodiment of the present disclosure, the writing control based on the asymmetric property of the writing error rate curve line with respect to the writing voltage of the magnetization reversal memory device is performed. Thus, it is possible to reduce the writing error rate as compared with, for example, a case where the state change of the magnetization reversal memory device is performed by applying the voltage of the fixed pulse width to the magnetization reversal memory device. Hence, it is possible to provide a semiconductor storage apparatus in which a writing error is further reduced. Note that the effects of the present technology are not necessarily limited to the effects described here, and may include any of the effects described herein.

The present application claims the benefit of Japanese Priority Patent Application JP2020-072873 filed with the Japan Patent Office on Apr. 15, 2020 and Japanese Priority Patent Application JP2020-188271 filed with the Japan Patent Office on Nov. 11, 2020, the entire contents of each of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A semiconductor storage apparatus, comprising:
    a plurality of memory cells divided into a plurality of groups, wherein
        each memory cell of the plurality of memory cells comprises:
            a magnetization reversal memory device; and
            a first switch device configured to control a current to flow to the magnetization reversal memory device;
    a plurality of wiring lines for each group of the plurality of groups, wherein
        each wiring line of the plurality of wiring lines is coupled to the first switch device of a corresponding memory cell of the plurality of memory cells;
    a plurality of second switch devices for each wiring line of the plurality of wiring lines; and
    a control circuit configured to:
        perform a writing control, based on an asymmetric property of a writing error rate curve line with respect to a writing voltage of the magnetization reversal memory device, wherein
            the writing control is performed with Wa and Wb,
            the Wa and the Wb are different based on an ON period of the first switch device,
            the Wa is a pulse width upon a write operation of a first state to the magnetization reversal memory device,
            the Wb is a pulse width upon a write operation of a second state to the magnetization reversal memory device, and
            the plurality of second switch devices is configured to control a supply, to the plurality of wiring lines, of a voltage to use upon the write operation of the second state to the magnetization reversal memory device.

2. The semiconductor storage apparatus according to claim 1, wherein,
    in a case where a pulse upon the write operation of the first state to the magnetization reversal memory device is a first pulse and a pulse upon the write operation of the second state to the magnetization reversal memory device is a second pulse, the control circuit is further configured to:
        output the first pulse to the magnetization reversal memory device in a writing period; and
        output the second pulse to the magnetization reversal memory device in a blanking period.

3. The semiconductor storage apparatus according to claim 2, wherein the control circuit is further configured to perform the writing control to cause the Wa to be smaller than the Wb by control of the ON period of the first switch device.

4. The semiconductor storage apparatus according to claim 1, wherein
    the control circuit is further configured to:
        divide the plurality of memory cells into the plurality of groups; and
        determine a necessity of the write operation of the second state to the each group of the plurality of groups, based on a state of the magnetization reversal memory device included in a single memory cell in the each group of the plurality of groups.

5. The semiconductor storage apparatus according to claim 1, wherein
    each memory cell of the plurality of memory cells includes:
        a plurality of magnetization reversal memory devices, wherein the plurality of magnetization reversal memory devices comprises the magnetization reversal memory device; and
        a plurality of first switch devices configured to control the current to flow to each magnetization reversal memory device of the plurality of magnetization reversal memory devices, wherein the plurality of first switch devices comprises the first switch device.

6. The semiconductor storage apparatus according to claim 5, wherein a first magnetization reversal memory device of the plurality of magnetization reversal memory devices is different from a second magnetization reversal memory device of the plurality of magnetization reversal memory devices in data retaining characteristic.

7. The semiconductor storage apparatus according to claim 6, wherein the first magnetization reversal memory device is different from the second magnetization reversal memory device in at least one a formation material or a size.

8. The semiconductor storage apparatus according to claim 7, wherein the first magnetization reversal memory device is different from the second magnetization reversal memory device in a height of layers.

9. The semiconductor storage apparatus according to claim 1, wherein
the plurality of memory cells is divided into a plurality of memory cell arrays, and
a first memory cell array of the plurality of memory cell arrays is configured by specific memory cells that include specific magnetization reversal memory devices in which a data retaining characteristic is different from that of a second memory cell array of the plurality of memory cell arrays.

10. The semiconductor storage apparatus according to claim 9, wherein
each memory cell of the plurality of memory cells includes:
a plurality of magnetization reversal memory devices, wherein the plurality of magnetization reversal memory devices comprises the magnetization reversal memory device; and
a plurality of first switch devices configured to control the current to flow to each magnetization reversal memory device of the plurality of magnetization reversal memory devices, wherein the plurality of first switch devices comprises the first switch device, and
the plurality of magnetization reversal memory devices included in a same memory cell has a same data retaining characteristic.

11. The semiconductor storage apparatus according to claim 9, wherein
the plurality of memory cell arrays includes:
the first memory cell array configured to temporarily hold data inputted to the semiconductor storage apparatus; and
the second memory cell array configured to store, in a nonvolatile manner, the data temporarily held in the first memory cell array, and
a second data retaining characteristic of the magnetization reversal memory device included in a memory cell that configures the second memory cell array is higher than a first data retaining characteristic of the magnetization reversal memory device included in a memory cell that configures the first memory cell array.

* * * * *